(12) United States Patent
Hong et al.

(10) Patent No.: US 9,840,774 B2
(45) Date of Patent: Dec. 12, 2017

(54) METHODS OF PREPARING HIGH DENSITY ALIGNED SILICON NANOWIRE

(71) Applicants: Northeastern University, Boston, MA (US); Korea Research Institute of Chemical Technology, Daejeon (KR)

(72) Inventors: Sanghyun Hong, Malden, MA (US); Yung Joon Jung, Boston, MA (US); Hyun Young Jung, Malden, MA (US); Sung-Goo Lee, Daejeon (KR); Youngjae Yoo, Daejeon (KR)

(73) Assignees: Northeastern University, Boston, MA (US); Korea Research Institute of Chemical Technology, Daejeon (KR)

( * ) Notice: Subject to any disclaimer, the term of this patent is extended or adjusted under 35 U.S.C. 154(b) by 343 days.

(21) Appl. No.: 14/410,014

(22) PCT Filed: Jun. 24, 2013

(86) PCT No.: PCT/US2013/047394
§ 371 (c)(1),
(2) Date: Dec. 19, 2014

(87) PCT Pub. No.: WO2013/192623
PCT Pub. Date: Dec. 27, 2013

(65) Prior Publication Data
US 2015/0337438 A1    Nov. 26, 2015

Related U.S. Application Data

(60) Provisional application No. 61/663,239, filed on Jun. 22, 2012.

(51) Int. Cl.
| | |
|---|---|
| *C23C 16/24* | (2006.01) |
| *C23C 16/455* | (2006.01) |
| *C23C 16/22* | (2006.01) |
| *C23C 16/46* | (2006.01) |
| *H01L 21/02* | (2006.01) |

(52) U.S. Cl.
CPC .......... *C23C 16/455* (2013.01); *C23C 16/22* (2013.01); *C23C 16/46* (2013.01); *H01L 21/0262* (2013.01); *H01L 21/02381* (2013.01); *H01L 21/02532* (2013.01); *H01L 21/02603* (2013.01); *Y10T 428/2933* (2015.01)

(58) Field of Classification Search
CPC ...... C23C 16/24; C23C 16/4481; C23C 16/46
See application file for complete search history.

(56) References Cited

U.S. PATENT DOCUMENTS

| | | | | |
|---|---|---|---|---|
| 2004/0175844 A1* | 9/2004 | Yang | ...................... | B82Y 10/00 438/2 |
| 2004/0262636 A1* | 12/2004 | Yang | ...................... | B82Y 10/00 257/200 |
| 2005/0176264 A1 | 8/2005 | Lai et al. | | |
| 2009/0050204 A1* | 2/2009 | Habib | ............... | H01L 31/03529 136/261 |
| 2009/0152527 A1 | 6/2009 | Lee et al. | | |
| 2010/0044072 A1* | 2/2010 | Wang | ...................... | C01B 33/06 174/126.1 |
| 2010/0273316 A1 | 10/2010 | Renard et al. | | |
| 2011/0047455 A1 | 2/2011 | Funes et al. | | |
| 2011/0151290 A1 | 6/2011 | Cui et al. | | |
| 2011/0309306 A1 | 12/2011 | Zhou et al. | | |
| 2014/0183450 A1* | 7/2014 | Shelke | ................... | B82Y 10/00 257/22 |

OTHER PUBLICATIONS

Morales, Alfredo M., et al., "A Laser Ablation Method for the Synthesis of Crystallien Semiconductor Nanowires". Science, vol. 279, Jan. 9, 1998, pp. 208-212.*

Huang, Bohr-Ran, et al., "Rice-straw-like structure of silicon nanowire arrays for a hydrogen gas sensor". Nanotechnology 24 (2013) 475502, pp. 1-8.*

Yasar-Inceoglu, Ozgul, et al., "Silicon nanocrystal production through non-thermal plasma synthesis: a comparative study between silicon tetrachloride and silane precursors". Nanotechnology 23 (2012) 255601, pp. 1-10.*

Schmidt, V., et al., "Growth, Thermodynamics, and Electrical Properties of Silicon Nanowires". Chem. Rev., 2010, 110, 361-388.*

Goodey, Adrian P., et al., "Silicon Nanowire Array Photoelectrochemical Cells". J. Am. Chem. Soc. 2007, 129, 12344-12345.*

Hu, et al., "The First Template-Free Growth of Crystalline Silicon Microtubes," Advanced Functional Materials, vol. 14(6), pp. 610-614 (2004).

International Search Report and Written Opinion issued by the U.S. Patent and Trademark Office as International Searching Authority for International Application No. PCT/US13/47394 dated Dec. 2, 2013 (10 pages).

Li, et al., "Raman Spectral Study of Silicon Nanowires," Physical Review B, vol. 59(3), pp. 1645-1648 (1999).

Liu, et al., "Raman Spectrum of Array-ordered Crystalline Silicon Nanowires," Physica E, vol. 23, pp. 221-225 (2004).

Naderi, N. and Hashim, M.R., "Effect of Surface Morphology on Electrical Properties of Electrochemically-Etched Porous Silicon Photodetectors," Int. J. Electrochem. Sci., vol. 7, pp. 11512-11518 (2012).

(Continued)

*Primary Examiner* — Bret Chen
(74) *Attorney, Agent, or Firm* — Posternak Blankstein & Lund LLP (57) ABSTRACT

A simple, economical method of producing nanowire arrays is described. The method produces high density arrays having nanowires with diameters below 10 nm and does not require templating, catalysts, or surface pre/post-treatment. The disclosed methods and systems can be used, for example, for optoelectronic devices and photovoltaic cells, Li-ion batteries, chemical/bio sensors and transistors.

26 Claims, 9 Drawing Sheets

(56) References Cited

OTHER PUBLICATIONS

Nolan, et al., "Silicon Nanowire Band Gap Modification," Nano Lett., vol. 7(1), pp. 34-38 (2007).
Hochbaum, "Controlled Growth of Si Nanowire Arrays for Device Integration," Nano Lett., vol. 5, No. 3, pp. 457-460 (2005).
Ma, et al., "Small-Diameter Silicon Nanowire Surfaces," Science, vol. 299, pp. 1874-1877 (2003).

* cited by examiner

METHODS OF PREPARING HIGH DENSITY ALIGNED SILICON NANOWIRE

CROSS-REFERENCE TO RELATED APPLICATION

This application is a National Stage Entry of PCT International Application No. PCT/US2013/047394 filed on Jun. 24, 2013 which claims the benefit of priority under 35 C.F.R. §119(e) to U.S. Patent Application Ser.No. 61/663,239, filed on Jun. 22, 2012, the contents of which are incorporated by reference herein in its entirety.

TECHNICAL FIELD

This technology relates generally to silicon nanowire arrays and methods of producing the same.

BACKGROUND

Silicon nanowires (SiNW) are important for many application, for example photovoltaics, Li-ion batteries, chemical/bio sensors and transistors. The ability to modify the silicon band gap and thus its optical properties by controlling the nanowire diameter is important for many of these applications. Large band gap changes are observed in silicon nanowires that have a diameter under 10 nm. However, high density nanowire arrays of silicon with such a small diameter are challenging to synthesize.

There exist multiple synthesis techniques for silicon nanowire arrays. For example, the VLS method (vapor-liquid-solid) is a mechanism for the growth of one-dimensional structures, such as nanowires, from chemical vapor deposition. The growth of one dimensional nanoscale crystals through direct adsorption of a gas phase on to a solid surface is challenging and generally very slow. The VLS mechanism circumvents this by introducing a catalytic liquid alloy phase (usually using noble metals) which can rapidly adsorb a vapor to supersaturation levels, and from which crystal growth can subsequently occur from nucleated seeds at the liquid-solid interface.

Other SiNW growth methods have also been developed. SiNWs have been grown using various chemical vapor deposition (CVD) methods, laser ablation, thermal evaporation/decomposition, supercritical fluid-liquid-solid (SFLS) synthesis, and wet methods like metal assisted etching or electrochemical anodizing. However, to date, there has been no simple, cost-effective method of making high density and aligned silicon nanowire arrays with nanowire diameters below 10 nm that have not required templating, catalysts, or surface pre/post-treatment.

VLS requires noble metal alloy catalysts that are very expensive. Additionally, the diameter of SiNWs depends on the size of metal catalyst particle (the "template" for growth). Thus, to synthesize small diameter SiNWs, one needs to use additional methods to reduce the size of the metal catalyst nanoparticles and to disperse them on the substrate. These techniques add to complexity and cost of the method. In addition, high density nanowire arrays are difficult to produce with VLS, reducing their advantageous surface area. Other methods that do not rely on VLS typically involve reaction catalysts that need to be removed from the nanowires after growth, or involve other post-treatment of the nanowires or pre-treatment of the substrate in order to achieve high density silicon nanowire arrays with below 10 nm diameter nanowires.

SUMMARY

A simple, economical method of producing silicon nanowire arrays is described. The method produces high density and aligned arrays having nanowires with diameters below 10 nm and does not require templating, catalysts, or surface pre/post-treatment. The disclosed methods and systems can be used, for example, for optoelectronic devices and photovoltaic cells.

In one aspect, a method of producing a silicon nanowire array includes providing a template-free silicon substrate; exposing a heated substrate to a carrier gas comprising hydrogen and a vaporized compound comprising at least silicon and chlorine; and producing a population of silicon nanowires on the substrate without the use of a catalyst, wherein the diameter of the nanowires is below 10 nanometers.

In one or more embodiments, the nanowires are aligned.

In one or more embodiments, the nanowires have 0-10% oxygen content.

In one or more embodiments, the vaporized compound is $SiCl_4$, $SiHCl_3$, $SiH_2Cl_2$, or $SiCl_2$.

In one or more embodiments, the heated substrate is heated to at least 900° C., or at least 1000° C., or at least 1100° C., or at least 1200° C.

In one or more embodiments, the heated substrate is heated to a temperature between 900 and 1200° C. or between 1000 and 1100° C.

In one or more embodiments, the substrate is heated at a rate of 10-20° C./min or 10-15° C./min.

In one or more embodiments, the silicon substrate is c-Si or poly-Si.

In one or more embodiments, the carrier gas comprises argon.

In one or more embodiments, the carrier gas comprises 10-20% hydrogen.

In one or more embodiments, exposing lasts 1 to 3 hours.

In one or more embodiments, the diameter of the nanowires is less than 5 nm or below 2 nm.

In one or more embodiments, the length of the nanowires is greater than 5 um or greater than 10 um or greater than 50 um.

In one or more embodiments, the surface area of the population of silicon nanowires is between 300 and 1000 $m^2/g$ or between 570 $m^2/g$ and 950 $m^2/g$.

In one or more embodiments, the substrate is maintained under pressure between 1 and 1.5 atm.

In one or more embodiments, the carrier gas flow rate is between 15 and 25 sccm, or between 17 and 21 sccm.

In another aspect, a product is made by the method of any of the preceding embodiments.

In another aspect, a secondary cell electrode is made by the method of any of the preceding embodiments.

BRIEF DESCRIPTION OF THE DRAWINGS

The invention is described with reference to the following figures, which are presented for the purpose of illustration only and are not intended to be limiting. In the Drawings:

FIGS. 1(a)-(c) are side view (a), top (b), and bottom (c) scanning electron microscopy (SEM) images of vertically aligned high density SiNWs on a (100) silicon substrate, according to one or more embodiments. The reaction took place for 3 hours at 1100° C., 1 atm, and 20 sccm flow rate of $SiCl_4$.

FIGS. 2(a)-(c) are high resolution tunneling electron microscope (HRTEM) images and diffraction patterns of silicon nanowires, according to one or more embodiments. (a) and (b) are images of the small diameter, under 2 nm, SiNWs bundles. (c) is a diffraction pattern of silicon nanowires.

FIGS. 2(d)-(e) are plots of the distribution of the diameters of silicon nanowires (d) and Raman spectra of the nanowires compared to bulk silicon (e), according to one or more embodiments. (d) shows that the average diameter of SiNWs is 1.8 nm, as analyzed by TEM images. The Raman spectra in (e) show that the Raman shift of SiNWs is lower in frequency than bulk silicon.

FIGS. 3(a)-(e) are SEM images of a lithographically patterned (100) silicon substrate after 1 hour of chemical vapor deposition conditions, according to one or more embodiments. (a) shows two different etch pit patterns on the substrate. (b)-(c) show low and high magnification images of the smaller etch pit pattern, respectively. (d)-(e) show low and high magnification images of the larger etch pit pattern, respectively.

FIGS. 4(a)-(d) are SEM images of Si(100) samples after different CVD (chemical vapor deposition) reaction times, according to one or more embodiments: (a) 1 minute of CVD at low magnification, (b) 1 minute of CVD at high magnification, (c) 15 minutes of CVD, (d) 30 minutes of CVD.

FIGS. 5(a)-(d) are SEM images of Si(111) samples after different CVD reaction times, according to one or more embodiments: (a) 1 minute of CVD at low magnification, (b) 1 minute of CVD at high magnification, (c) 15 minutes of CVD, (d) 30 minutes of CVD.

FIGS. 6(a)-(d) are SEM images of the Si(100) substrate after 3 hours of CVD exposure, according to one or more embodiments. (a) top view, (c) cross-sectional view, (b) and (d) are high magnification images of areas shown in (a) and (c), respectively.

FIGS. 7(a)-(b) are SEM images of substrates after 30 min of CVD exposure without hydrogen gas, according to one or more embodiments. (a) shows a Si (100) wafer and (b) shows a Si (111) wafer.

FIGS. 8(a)-(e) are schematics (a)-(c) and SEM images of terrace formation on a Si(111) sample after CVD exposure, according to one or more embodiments. (d) is an SEM image of the etched surface. (e) is an SEM image of the SiNWs array on the rough terrace shown in (d).

FIGS. 9(a)-(e) are images and plots showing the optical properties of the silicon nanowire films, according to one or more embodiments. (a) is an optical microscopy (OM) image of SiNW film on a Si(100) substrate after 1 hour of reaction time. (b) is an SEM image of same SiNW film as in (a), showing less than 1 μm long nanowires. (c) is a cross-sectional SEM image of a SiNW array after 2 hours of CVD exposure, resulting in 9.4 μm long nanowires. (d) is a cross-sectional SEM image of a SiNW array after 3 hours of CVD exposure, resulting in 37 μm long nanowires. The SiNW films in (c) and (d) were transferred to transparent PDMS substrates for optical analysis. (e) is a plot of transmittance versus wavelength of the transferred SiNW array film with different film thickness.

DETAILED DESCRIPTION

In the instant disclosure, chemical vapor deposition (CVD) methods were used to produce well-aligned, high density silicon nanowire arrays without the use of a catalyst. The CVD methods are simple and economical, producing high purity and high performance solid materials with fewer byproducts. In some embodiments, no catalyst is required, allowing for production of high-purity materials without any post-treatment refining or etching. In some embodiments, no pretreatment or templating of the substrate is required (e.g., etching of oxide layer, deposition of noble metal catalyst, etc.). In some embodiments the substrate is "template-free", e.g. free from applied nanoparticles or physical patterning.

In some embodiments, the method involves providing a silicon substrate, heating the substrate, and exposing the substrate to compounds in the vapor phase that include at least silicon and chlorine in a carrier gas that includes hydrogen.

In some embodiments, the compounds in the vapor phase are vapor, gas, or solid (powder) at room temperature. The compounds may be $SiCl_4$, $SiHCl_3$, $SiH_2Cl_2$, $SiCl_2$, or other compounds containing silicon, chlorine, and optionally hydrogen. Without being bound by theory, $SiCl_4$ and $H_2$ is preferred as it is believed to etch the native oxide layer of the silicon substrate and expose the crystalline surface of the substrate for formation of SiNWs without surface pretreatment. Hydrogen can passivate the silicon surface during production (preventing native oxide formation) but can also become the active agent for etching.

Without being bound by theory, the possible chemical reactions for etching of the silicon substrate and the potential growth of the nanowires are described below, using $SiCl_4$ as the starting vapor phase compound Etching Process:

$Si + SiCl_4 \leftrightarrow 2SiCl_2$ $Si + SiCl_2 \leftrightarrow 2SiCl$ $Si + H_2 \leftrightarrow Si{-}H$ Growth Process:

$SiCl_4 + H_2 \rightarrow Si + HCl$ $SiCl_4 + H_2 \leftrightarrow SiHCl_3 + HCl$ $SiHCl_3 + H_2 \leftrightarrow SiH_2Cl_2 + HCl$ $SiH_2Cl_2 + H_2 \leftrightarrow SiCl_2 + HCl$ $SiCl_2 + H_2 \leftrightarrow Si + 2\,HCl$ However, the exact formation mechanism is still under investigation.

Various carrier gases and various hydrogen ratios are contemplated. The gas flow rate during the reaction is between 15-25 sccm, or 17-21 sccm. In some embodiments, the carrier gas includes argon. In some embodiments, the carrier gas includes 20, 15, or 10% hydrogen gas. In some embodiments, the reaction takes place at 1.5 atmosphere, or 1 atmosphere.

In some embodiments, the substrate may be heated to 900-1200° C., or 1000-1100° C. In some embodiments, the substrate and surrounding atmosphere is heated to a temperature above the vapor pressure of the compounds in the vapor phase. The heating ramp may be 10-20° C./min, or 10-15° C./min.

In some embodiments, the substrate includes, for example, c-Si, poly-Si, and various Si structures. The silicon substrate could include silicon wafers, particles, ribbon, etc. In some embodiments, silicon-based compound materials, such as silicon carbide (SiC) can be synthesized.

The reaction time can range between 1 minute and 3 hours, or between 30 minutes and 1 hour. The reaction time can be used to control the length of the nanowires.

Figure 1A:
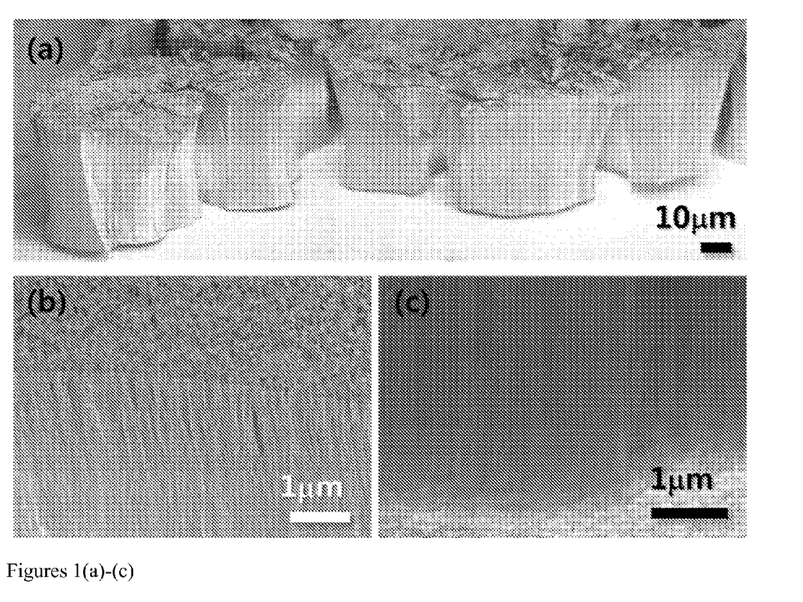

The produced SiNWs are highly-densified and have a stable structure. As shown in FIGS. 1(a)-(c), the SiNWs may be vertically aligned with the substrate and have a very high surface area and small diameter. In some embodiments, the diameter is below 10 nm, or below 5 nm, or below 2 nm and the length of the nanowires is above 5 um, or above 10 um, or above 50 um. In some embodiments, the surface area is between 300 and 1000 m²/g or between 570 m²/g and 950 m²/g. In some embodiments, the nanowires have a growth direction of <110>, <100>, <211> or <111> with respect to the silicon substrate orientation. In some embodiments, the growth direction is controlled by the selection of the substrate crystal orientation. For example, <100> and <110> oriented nanowires can be produced from a Si(100) surface or <111> and <110> oriented nanowires can be produced from a Si(111) surface. The nanowires may be single crystal or poly crystalline or amorphous.

In some embodiments, the silicon nanowires contain 0-10% oxygen content.

Figure 2A:
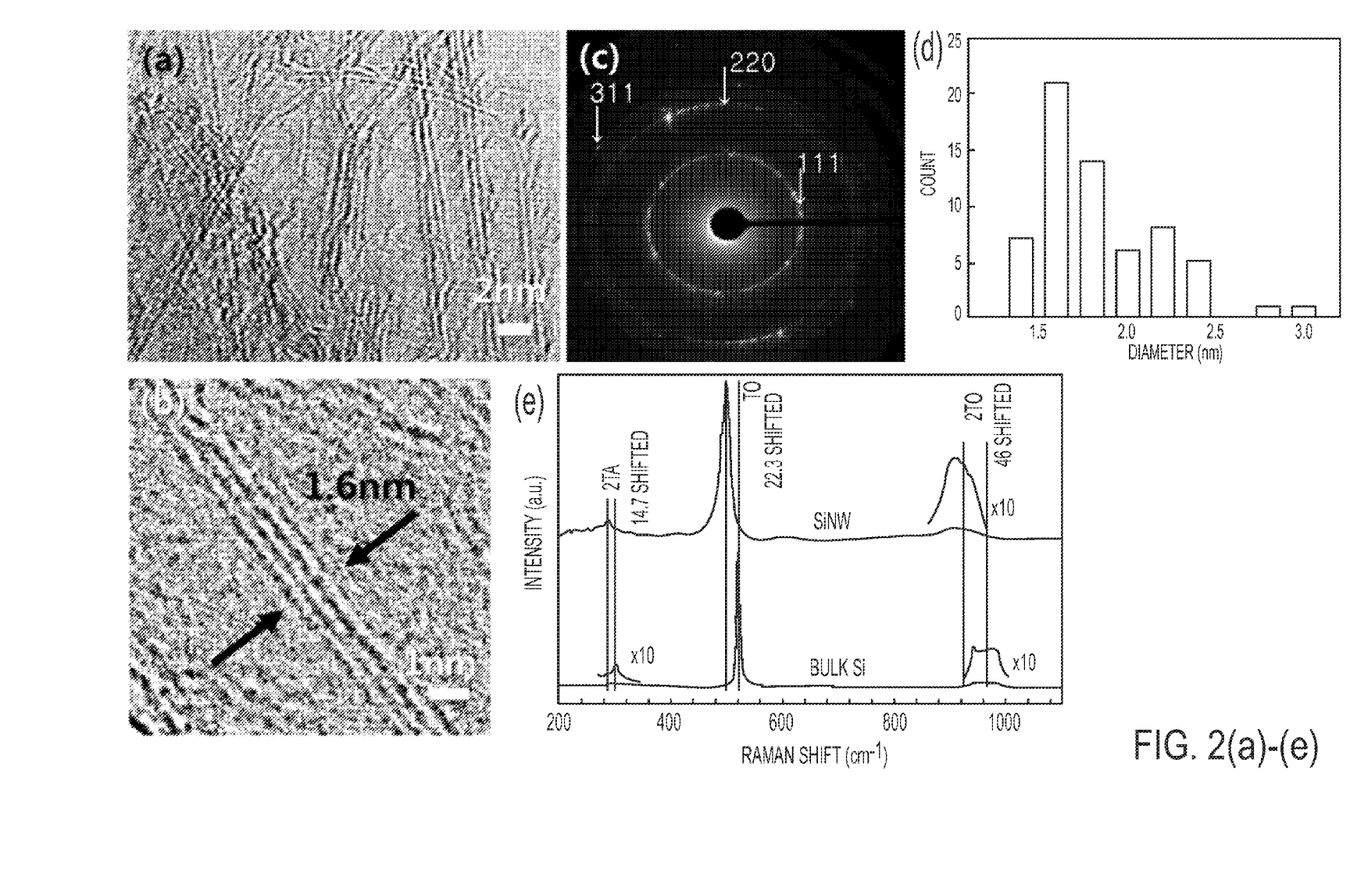

As the electronic properties of SiNWs can be manipulated by changing their diameter, the ability to control the produced SiNW diameters is useful for many applications, including but not limited to transistors, energy storage devices and sensors. As shown in FIGS. 2(a)-(e), the average diameter of nanowires produced according to one or more embodiments is 1.8 nm, as analyzed by TEM images. The Raman spectra in FIG. 2(e) show that the Raman shift of SiNWs is lower in frequency as compared to bulk silicon. The Raman shift provides further evidence of the small diameter of the nanowires. The observed blue shift and broadening of the peak width are because of the vibrations of the narrow silicon structure. Some models for this Raman spectrum are known in the art. For example, the MCM model predicts that: (a) 13 nm diameter SiNWs lead to a peak at 504 cm$^{-1}$; (b) 20 nm diameter SiNWs lead to a peak at 511 cm$^{-1}$; (c) Bulk silicon Si is predicted to have a peak at 520 cm$^{-1}$ (Source: *Physics Review B*, 59(3), 1645). One theory postulates that the FWHM (full width half max) of the peak increase is associated with the disorder at the boundaries of the crystallites which leads to a decrease of the phonon time. A qualitative explanation of shift of the first-order optical phonons of SiNWs is given in the phonon confinement model. In an ideal crystal, the correlation length is infinite, and hence the phonon eigenstates are plane waves. Therefore the usual vector k=0 momentum selection rule of the first-order Raman spectrum can be satisfied (Source: J. Liu et al., *Physica E* 23 (2004) 221-225).

The present invention will be explained in more detail with reference to the following examples. Materials, amounts of uses, ratios, operations and so forth described hereinafter are properly be altered without departing from the spirit of the present invention. The scope of the present invention, therefore, is not limited to specific examples described below. The invention is applicable to any form of battery, e.g. prismatic, button-cell, can, etc.

EXAMPLES

A 2 inch inner diameter and 46 inch long alumina tube was used as a reaction chamber. A furnace was used for heating the substrate. A bubbler system was used to measure the gas flow rate of the vapor phase compound. The flow rate was controlled with a gas flow rate controller. Mixture of pure argon and hydrogen was used as a carrier gas with various ratios.

(111) and (100) silicon wafer samples were cut into 1 cm by 1 cm pieces. An alumina tray located at the center of the furnace was used to hold the wafers. The chamber was filled with argon gas. Temperature was ramped up at 10° C./min. After it reached at 1100° C., SiCl$_4$ vapor was introduced into the chamber. The details are described below.
CVD conditions
Temperature: 1100° C.
Pressure: 1 atm
Reaction times: 1-3 hours
Gas flow rate: 20 sccm
Carrier gas: 10% Hydrogen balanced Argon After the reaction time has lapsed, the furnace was turned off and the samples were removed from the furnace once they have cooled to below 50° C.

The samples were imaged using Scanning Electron Microscopy (SEM). Transmission Electron Microscopy (TEM) was used to determine size and crystallinity of the nanowires (FIGS. 2(a)-(d)). Raman Spectroscopy (FIG. 2(e)) and Energy Dispersive Spectroscopy (EDS) was used to analyze the atomic composition of the nanowires. Optical microscopy was used to image the sample and determine their optical properties.

Results

According to EDS measurements, the typical silicon nanowires are 90% of silicon and 9% oxygen and less than 1% other components. As known in the art, these purity levels can be improved significantly by modifying the reaction chamber, using high vacuum and improved sealing.

FIGS. 1(a)-(c) show side view (a), top (b), and bottom (c) scanning electron microscopy (SEM) images of exemplary vertically aligned high density SiNWs on a (100) silicon substrate. This reaction took place for 3 hours at 1100° C., 1 atm, and 20 sccm flow rate of SiCl$_4$.

As shown in FIGS. 2(a)-(e), the average diameter of nanowires produced according to one or more embodiments is 1.8 nm, as analyzed by TEM images. FIG. 2(c) shows a typical diffraction pattern of a nanowire. The 111, 220 and 311 rings are typical patterns for crystalline Si. The pattern inside the 111 ring is a fractional diffraction pattern or diffraction pattern of the hexagonal structure. Diffused ring patterns are typical for nanostructures with small dimensions.

Figure 3A:
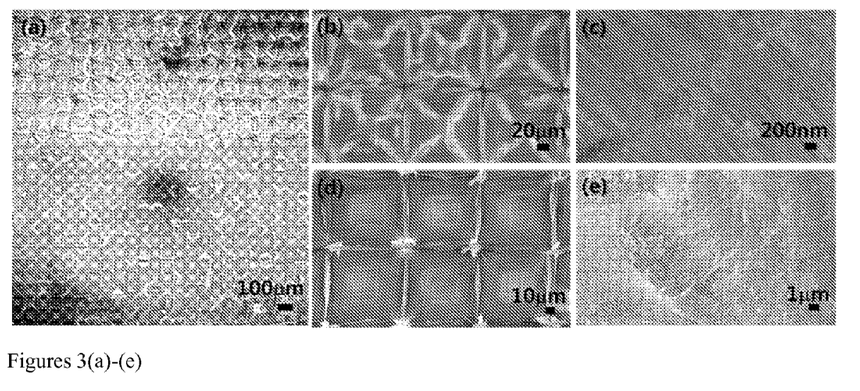

In some embodiments, different etch pit patterns originated on different areas of the same substrate. FIG. 3 (a)-(e) shows SEM images of a lithographically patterned (100) silicon substrate after 1 hour of chemical vapor deposition with two different pit patterns and nanowire morphologies. In some embodiments, roughness of etched surfaces strongly depends on the orientation of silicon surface.

In some cases, silicon nanowire growth occurred on the substrate at etch pit locations and away from etch pits.

Figure 4A:
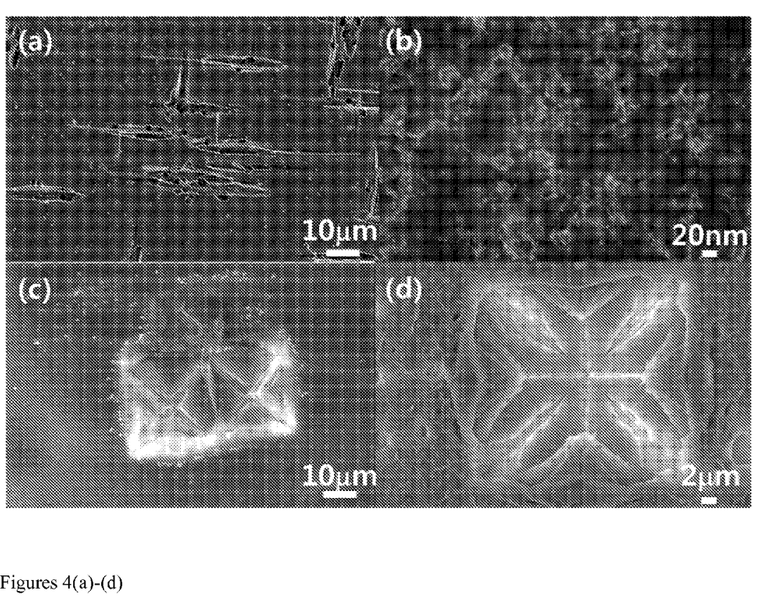
Figure 5A:
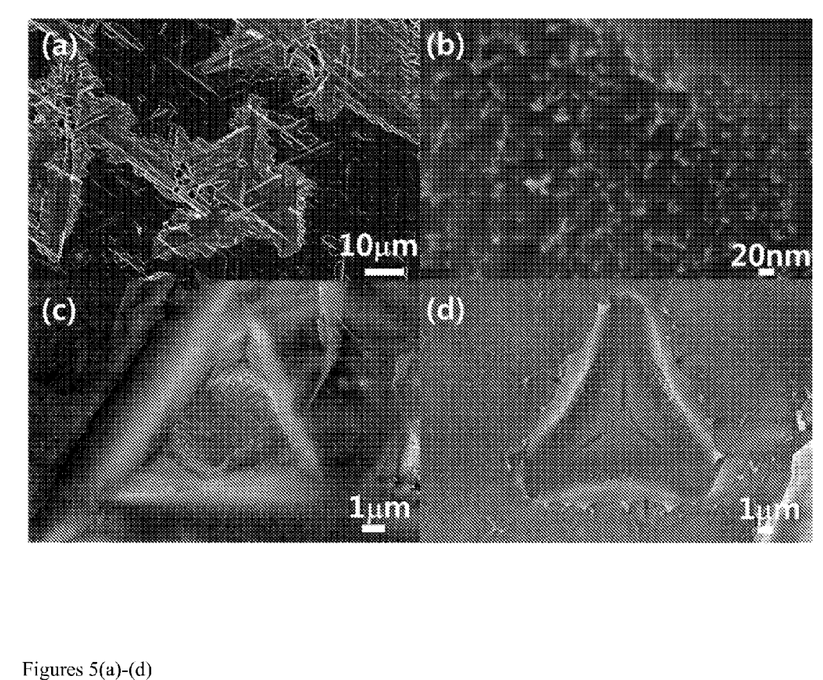
Figure 6A:
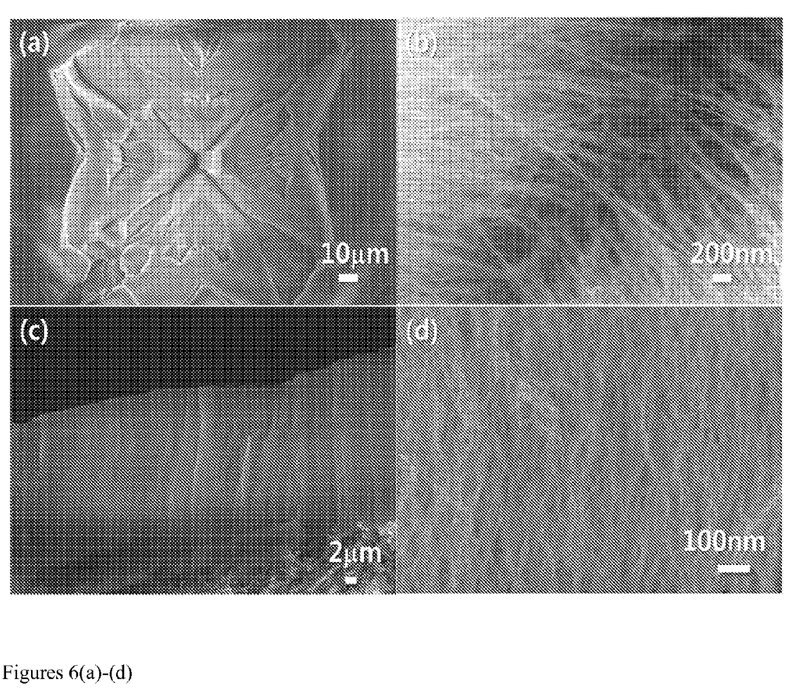

In some embodiments, changes in reaction time resulted in different surface morphologies. FIGS. 4 and 5 show SEM images of Si(100) and Si(111) samples respectively, after different CVD reaction times. FIGS. 2 (a) and (b) are the results of 1 min of CVD exposure. They show nucleation of nanowires at a very early stage. In FIGS. 2 (c) and (d) (after 15 and 30 minutes of exposure), the etched area is expanding and the length of SiNWs is getting longer over time. For the Si(111) substrate, FIGS. 5(a)-(d) show similar results, but with different etching and growth directions.

In FIGS. 6(a)-(d), Si(100) has been exposed to 3 hours of CVD conditions. In this case, the resulting SiNW have a high density and a long length. In the cross-sectional view (c), the length of SiNWs is several tens of micrometers.

Figure 7A:
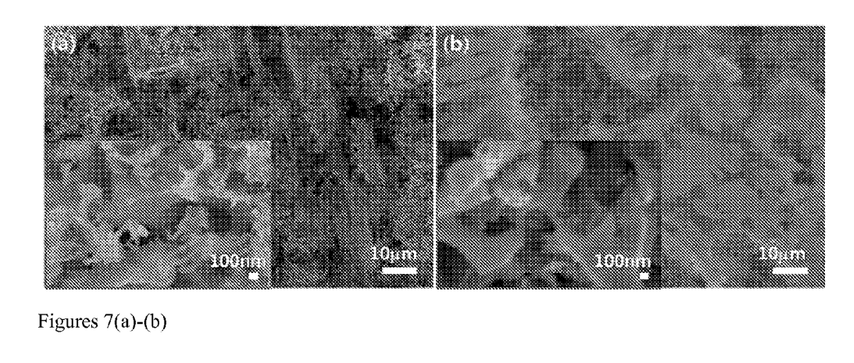

It was found that the presence of hydrogen is important in the silicon nanowire growth process in some embodiments. As is shown in FIGS. 7(a)-(b), after 30 min of CVD exposure without hydrogen gas silicon nanowires did not develop on either (a) Si (100) wafer or (b) Si (111) wafers.

Figure 8A:
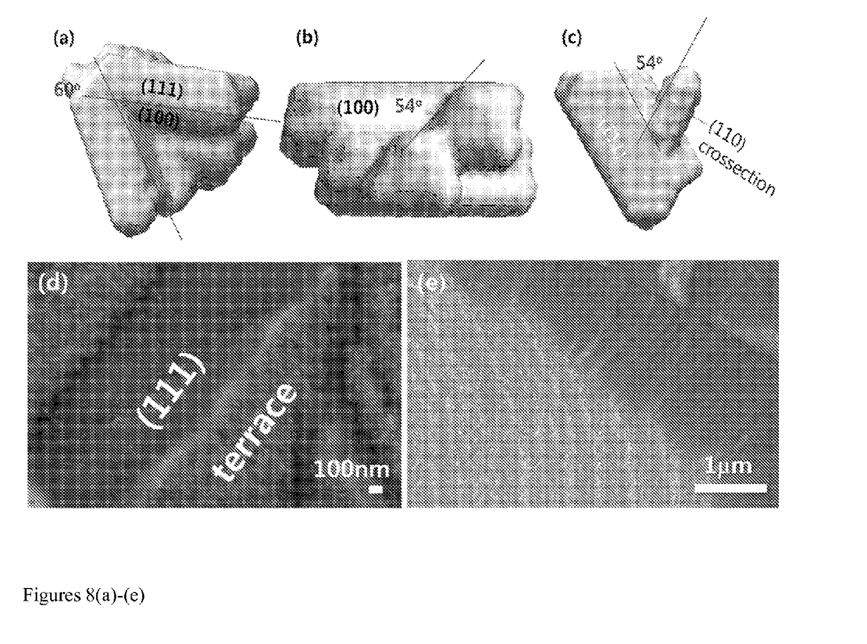

The present disclosure provides methods for growing well-aligned SiNW arrays. FIGS. 8(a)-(e) show the morphology of etched (111) silicon wafer and the growth direction of the nanowires from the (111) surface and the (100) terrace. FIGS. 8 (a), (b) and (d) show the formation of a nucleation site on the roughly etched Si (100) surface ("terrace") with patterns. It has also been observed that (100) wafers show more directionality of SiNW formation. FIGS. 8 (c) and (e) show that SiNWs prefer to grow along the <110> direction. Vertical nanowires in the <100> or <111> directions have been produced on (100) and (111) silicon wafers respectively. While not being bound by theory, SiNWs which have a diameter of less than 20 nm are expected to grow primarily along <110> direction due to free energy considerations, including edge and interfacial tensions.

Figure 9A:
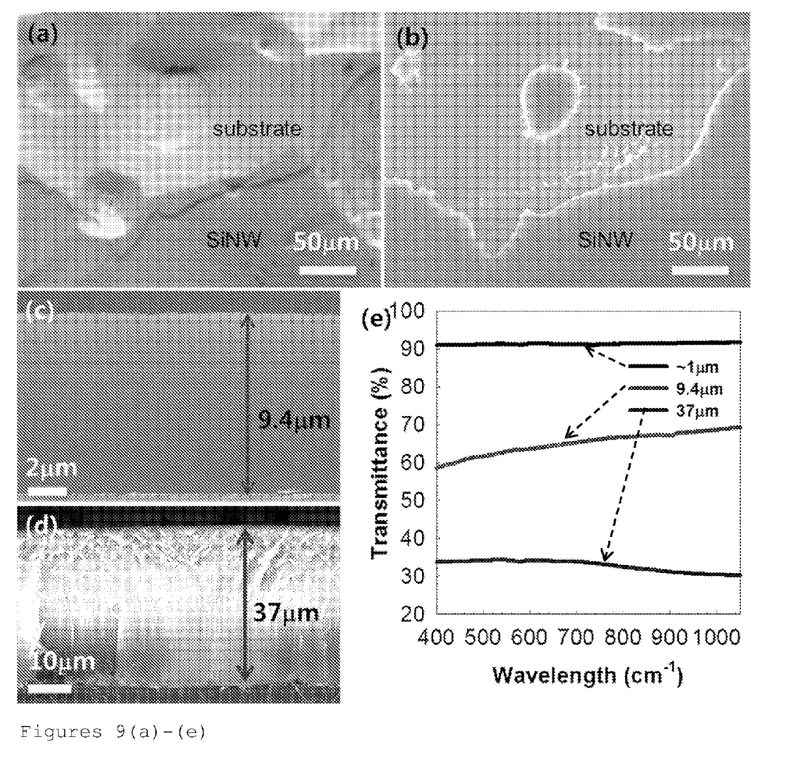

Optical properties of the nanowire arrays were investigated. FIG. 9(a) is an optical microscopy (OM) image of SiNW film on a Si(100) substrate after 1 hour of reaction time. FIG. 9(b) is an SEM image of same SiNW film as in (a), showing less than 1 μm long nanowires. FIG. 9(a) shows that the substrate is transparent to light as the bottom surface of the silicon wafer can be seen. This is not visible in SEM (9(b)) was electrons cannot penetrate the silicon nanowires. FIG. 9(c) is a cross-sectional SEM image of a SiNW array after 2 hours of CVD exposure, resulting in 9.4 um long nanowires. FIG. 9(d) is a cross-sectional SEM image of a SiNW array after 3 hour of CVD exposure, resulting in 37 um long nanowires. The SiNW films in FIGS. 9 (c) and (d) were transferred to transparent PDMS substrates for optical analysis. FIG. 9(e) is a plot of transmittance versus wavelength of the transferred SiNW array film with different film thickness, showing that greater thickness results in reduced transmittance. Controlled thickness is useful for different applications. For example, thinner films can be used for transparent electrodes or flexible devices, and thicker films can be used for high performance solar cells which can absorb various light frequencies from sun. Thicker films are more efficient in light capture for solar cell applications (Source: *Int. J. Electrochem. Sci.* 7 (2012), 11512).

Applications

Silicon nanowire arrays according to certain embodiments of this disclosure can be used for various applications, for example in lithium ion batteries. Slicon has a high theoretical charge capacity (4,200 mAh/g). This capacity is much higher than that of graphite (370 mAh/g), which is traditionally used for anodes. Previously, the mechanical instability of silicon due its large volume changes (~400%) during charging and discharging and subsequent loss of capacity have hindered its widespread use in secondary cells. However, the mechanically stable 1D nanostructures of the instant disclosure may provide a solution to this problem, allowing the nanowire arrays to be used as anodes with reduced capacity loss during cycling.

Optoelectronic devices and photovoltaic cells are another potential application of the disclosed nanowire arrays. As is known in the art, silicon has an indirect band gap approximately 1.1 eV wide. For indirect band gaps, phonon effects must be considered along with photon interactions. Strong phonon interactions slow down optical processes and may lead to heat generation or even mechanical collapse of the silicon structure. However, if the diameter of SiNWs is 5 nm or below, the band gap type can be changed from indirect to direct via the quantum size effect. For materials with direct band gaps, electrons can emit a photon when they move from the conduction band to the valance band, and phonon effects can be ignored. Thus, decreasing the nanowire diameter can lead to more efficient devices. The nanowire diameter can also change the band gap width of silicon from 1.1 eV up to 3.5 eV, or even higher. For example, the band gap of hydrogen terminated SiNW with 1 nm diameter will be around 3.5 eV wide (Source: *Nano Lett.* 7(1) 2007, 34). A wider band gap means electrons can emit low wavelength light like visible or even ultraviolet, changing the optical output of the material.

A third application of the disclosed nanowire arrays is biosensors with optical or -electrical detection mechanisms. In certain embodiments, the instant SiNW arrays have relatively high surface areas, which can lead to more effective molecule detection than with porous or bulk silicon structure. Additionally, silicon is biocompatible and susceptible to chemical surface derivatization.

The corresponding structures, materials, acts and equivalents of all means or step plus function elements in the claims below are intended to include any structure, material, or acts for performing the functions in combination with other claimed elements as specifically claimed.

The invention claimed is:

1. A method of producing a silicon nanowire array comprising:
   providing a template-free silicon substrate;
   heating the substrate and exposing the heated substrate to a carrier gas comprising hydrogen mixed with a vaporized compound comprising at least silicon and chlorine; and
   producing a population of silicon nanowires on the substrate without the use of a catalyst, wherein the nanowires have diameters below 10 nanometers.

2. The method of claim 1, wherein the nanowires are aligned.

3. The method of claim 2, wherein the nanowires have 0-10% oxygen content.

4. The method of claim 1, wherein the nanowires have 0-10% oxygen content.

5. The method of claim 1, wherein the vaporized compound comprises $SiCl_4$, $SiHCl_3$, $SiH_2Cl_2$, or $SiCl_2$.

6. The method of claim 1, wherein the heated substrate is heated to at least least 900° C.

7. The method of claim 1, wherein the heated substrate is heated to a temperature between between 900 and 1200° C.

8. The method of claim 1, wherein the substrate is heated at a rate of 10-20° C./min.

9. The method of claim 1, wherein the silicon substrate is c-Si or poly-Si.

10. The method of claim 1, wherein the carrier gas further comprises argon.

11. The method of claim 1, wherein the carrier gas comprises 10-20% hydrogen.

12. The method of claim 1, wherein said exposing lasts 1 to 3 hours.

13. The method of claim 1, wherein the diameters of the nanowires are less than 5 nm.

14. The method of claim 1, wherein the nanowires have lengths greater than 5 μm.

15. The method of claim 1, wherein the population of silicon nanowires has a surface area between 300 and 1000 $m^2/g$.

16. The method of claim 1, wherein the substrate is maintained under pressure between 1 and 1.5 atm.

17. The method of claim 1, wherein the carrier gas has a flow rate between 15 and 25 sccm.

18. The method of claim 1, wherein the heated substrate is heated to at least 1000° C.

19. The method of claim 1, wherein the heated substrate is heated to at least 1100° C.

20. The method of claim 1, wherein the heated substrate is heated to at least 1200° C.

21. The method of claim 1, wherein the heated substrate is heated to a temperature between 1000 and 1100° C.

22. The method of claim 1, wherein the diameter of the nanowires is below 2 nm.

23. The method of claim 1, wherein the nanowires have lengths greater than 10 μm.

24. The method of claim 1, wherein the nanowires have lengths greater than 50 μm.

25. The method of claim 1, wherein the population of silicon nanowires has a surface area between 570 $m^2/g$ and 950 $m^2/g$.

26. The method of claim 1, wherein the carrier gas has a flow rate between 17 and 21 sccm.

* * * * *